US011552031B2

(12) United States Patent
Wan et al.

(10) Patent No.: US 11,552,031 B2
(45) Date of Patent: Jan. 10, 2023

(54) HIGH PRECISION BONDING APPARATUS COMPRISING HEATER

(71) Applicant: ASMPT SINGAPORE PTE. LTD., Singapore (SG)

(72) Inventors: Ming Yeung Luke Wan, Hong Kong (HK); Wai Kin Cheung, Hong Kong (HK); Yu Fu Cheung, Hong Kong (HK)

(73) Assignee: ASMPT SINGAPORE PTE. LTD., Singapore (SG)

( * ) Notice: Subject to any disclaimer, the term of this patent is extended or adjusted under 35 U.S.C. 154(b) by 424 days.

(21) Appl. No.: 16/817,880

(22) Filed: Mar. 13, 2020

(65) Prior Publication Data
US 2021/0288004 A1  Sep. 16, 2021

(51) Int. Cl.
*H01L 23/00*  (2006.01)
*H01L 21/68*  (2006.01)
*H05K 13/04*  (2006.01)
*H01L 21/683*  (2006.01)

(52) U.S. Cl.
CPC .......... *H01L 24/02* (2013.01); *H01L 21/6836* (2013.01); *H01L 24/27* (2013.01); *H01L 24/29* (2013.01); *H01L 24/73* (2013.01)

(58) Field of Classification Search
CPC ..... H01L 24/02; H01L 21/6836; H01L 24/27; H01L 24/29; H01L 24/73; H01L 21/681; H01L 21/67144; H01L 24/741; H01L 21/67092; H01L 21/67265;
(Continued)

(56) References Cited

U.S. PATENT DOCUMENTS

| 3,696,229 A | 10/1972 | Angelucci |
| 7,727,800 B2 * | 6/2010 | Wan ...................... H01L 21/681 |
| | | 29/721 |
| 2005/0127136 A1 | 6/2005 | Haraguchi |
| (Continued) | | |

FOREIGN PATENT DOCUMENTS

| CN | 1983539 A | 6/2007 |
| TW | 201606881 A | 2/2016 |

OTHER PUBLICATIONS

Taiwanese Office Action, dated Feb. 10, 2022 issued in corresponding Taiwanese Patent Application No. 110105436. English translation. Total 12 pages.

*Primary Examiner* — Shahed Ahmed
*Assistant Examiner* — Khatib A Rahman
(74) *Attorney, Agent, or Firm* — Ostrolenk Faber LLP

(57) ABSTRACT

A bonding apparatus includes a bond head structure, an optical unit and an actuator unit. The bond head structure includes a bond head collet, a connecting unit to which the bond head collet is attached and a look-through passage extending through the bond head collet and the connecting unit along a central axis of the bond head structure. In use, the bond head collet holds an electrical component to be bonded to a bonding area of a base member and the optical unit is positioned relative to the bond head structure to view and inspect the electrical component through the look-through passage of the bond head structure. The actuator unit moves the connecting unit of the bond head structure based on the inspection of the electrical component by the optical unit, to align the electrical component with the bonding area of the base member.

18 Claims, 11 Drawing Sheets

(58) Field of Classification Search
CPC ......... H01L 21/67103; H01L 21/67721; H01L 23/544; H01L 2223/54426; H05K 13/0404
See application file for complete search history.

(56) References Cited

U.S. PATENT DOCUMENTS

| | | |
|---|---|---|
| 2008/0268571 A1 | 10/2008 | Kim |
| 2014/0311652 A1* | 10/2014 | Kostner ................. H01L 24/75 156/60 |
| 2017/0148759 A1 | 5/2017 | Hayata |
| 2021/0069811 A1* | 3/2021 | Choi ....................... H01L 25/50 |

* cited by examiner

HIGH PRECISION BONDING APPARATUS COMPRISING HEATER

FIELD OF THE INVENTION

The present invention generally relates to a bonding apparatus having a bond head collet with a look-through passage therethrough for viewing an electrical component held by the bond head collet.

BACKGROUND OF THE INVENTION

The fabrication of a semiconductor device often involves a bonding process during which, an electrical component is attached to a bonding area of a base member using a securing material. For example, the electrical component may be a die, the base member may be a substrate, and the securing material may be an adhesive such as epoxy. A bonding process is usually performed with a bonding apparatus including a bond head collet. The bond head collet picks up an electrical component from a component holder, for example a wafer or wafer tray, and then places the electrical component in contact with a base member on which securing material has been dispensed. Bond forces are then exerted on the electrical component to urge the electrical component against the base member to complete the bonding process. The bond forces are typically exerted over a certain period of time. During this period of time, heat may be applied to the securing material to change a state of the securing material, so that the securing material is capable of holding the electrical component and the base member together.

Occasionally, the electrical component may not be aligned with the bonding area of the base member during the bonding process. This can affect the quality of the semiconductor device eventually formed.

Methods to align the electrical component with the bonding area of the base member prior to the bonding process have been developed. Some of these methods use fiducial marks commonly found on electrical components to determine the positions and orientations of the electrical components relative to corresponding bonding areas. For example, images showing the fiducial marks of the electrical component may be captured and used to determine the position and/or orientation of the electrical component. The electrical component may then be adjusted accordingly using the captured images for alignment of the electrical component with the bonding area.

In general, images of fiducial marks on the electronic component are captured prior to its pick-up by the bond head collet. Due to the location of the bond head collet in typical bonding apparatuses, it is usually difficult to capture an image that clearly shows the fiducial marks of the electrical component when it is being held by the bond head collet. Further, several currently available methods for aligning electrical components with corresponding bonding areas can only be employed for electrical components of a specific size or electrical components having fiducial marks arranged in a specific pattern.

SUMMARY OF THE INVENTION

The present invention aims to provide a new and useful bonding apparatus.

In general terms, the present invention proposes a bonding apparatus with a look-through passage through the bond head collet to allow an optical unit to directly view an electrical component held by the bond head collet through the look-through passage when the bond head collet is above a bonding area.

Specifically, a first aspect of the present invention is a bonding apparatus including: a bond head structure including: a bond head collet configured to hold an electrical component to be bonded to a bonding area of a base member; a connecting unit to which the bond head collet is attached; and a look-through passage extending through the bond head collet and the connecting unit along a central axis of the bond head structure; an optical unit positioned relative to the bond head structure to view and inspect the electrical component through the look-through passage of the bond head structure; and an actuator unit configured to move the connecting unit of the bond head structure based on the inspection of the electrical component by the optical unit, to align the electrical component with the bonding area of the base member.

In the above bonding apparatus, the optical unit first captures images of fiducial marks on the base member, and the bond head collet that has picked up an electronic component moves to a position above a bonding area of the base member. The look-through passage extending through the connecting unit and the bond head collet along the central axis of the bond head structure may allow an electrical component held by the bond head collet to be better viewed by the optical unit. Accordingly, direct inspection of the electrical component may be performed and improved alignment of the electrical component with the bonding area of the base member can be achieved. Both the inspection of fiducial marks on the base member and on the electronic component are viewed by the optical unit at essentially the same vertical position. This in turn helps to minimise the movement of the bond head collet and the optical unit, to thereby improve the accuracy of the bonding process. Thus, the quality of the bond between the electrical component and the bonding area can be improved.

The look-through passage may include at least one slot. This helps to simplify the design process if the orientations and positions of the fiducial marks on both the base member and the electronic components are well-defined. The look-through passage may also include a plurality of slots radially arranged around the central axis. The plurality of slots may be arranged with a same angle between adjacent slots.

The look-through passage may include a first portion including the at least one slot and a second portion including a circular aperture, wherein the second portion may be nearer to the optical unit than the first portion. By having the look-through passage include a circular aperture, the view of the electrical component by the optical unit may be less affected by slight misalignments between the first and second portions during the fabrication process. In addition, fabrication of the bonding apparatus may also be easier with the circular aperture, since such an aperture may be more easily formed as compared to the at least one slot.

The connecting unit may include a plurality of central apertures substantially aligned to form the look-through passage of the bond head structure, where each central aperture may have a transverse width perpendicular to the central axis, and at least two of the transverse widths of the central apertures may be different. For example, the transverse widths of the central apertures may decrease at further distances away from the optical unit. In this manner, the light path for effective inspection of fiducial marks on the electronic component by the optical unit will not be blocked by any parts situated along the central apertures. Furthermore, the smaller the transverse width of the central apertures, the larger the contact area between the adjoining parts. This will assist in improving heat transfer and force transmission during the bonding process.

At least two of the central apertures of the connecting unit may include cross-sections with a same shape, where the cross-sections may be perpendicular to the central axis. This can simplify the fabrication process of the bonding apparatus.

At least two of the central apertures of the connecting unit may include cross-sections perpendicular to the central axis with different shapes. The view of the electrical component by the optical unit may be less affected by slight misalignments between the central apertures having cross-sections with different shapes during the fabrication process.

The bond head collet may include at least one fiducial aperture that is substantially aligned with the central apertures of the connecting unit to form the look-through passage of the bond head structure. The at least one fiducial aperture may comprise at least one cut-out from the bond head collet that is aligned with and slightly larger than one or more fiducial marks formed on the electrical component that are viewable through the central apertures. This can simplify the fabrication process of the bonding apparatus.

The electrical component may include a surface having a fiducial mark thereon, and the look-through passage may be configured to allow the optical unit to view and inspect the fiducial mark through the look-through passage. This may allow the fiducial mark to be used for the alignment between the electrical component and the bonding area of the base member.

The look-through passage may be configured to allow the optical unit to view and inspect the fiducial mark such that a boundary of the look-through passage is arranged at least partially around the fiducial mark. For example, the look-through passage may include a slot and may be configured to allow the optical unit to view and inspect the fiducial mark at an end of the slot. This can help facilitate the locating of the fiducial mark in the view of the electrical component by the optical unit.

The fiducial mark may be a first fiducial mark and the surface of the electrical component may include a second fiducial mark thereon, and the look-through passage may include a plurality of slots and may be configured to allow the optical unit to view the first and second fiducial marks of the electrical component through different slots. This can help facilitate the locating of each fiducial mark in the view of the electrical component by the optical unit, and thus, both fiducial marks can be used for aligning the electrical component with the bonding area of the base member. A more accurate alignment may thus be achieved.

The connecting unit may include an adaptor member to which the bond head collet is attached and an actuating member attached between the adaptor member and the actuator unit. The adaptor member may serve as a holder for various components to be used for the bonding process. The actuating member may be attached to more actuator units as compared to the bond head collet, and hence, a greater degree of freedom in the movement of the bond head collet may be achieved by using the actuating member.

The connecting unit may include a heating unit configured to provide heat during bonding of the electrical component to the bonding area of the base member. By configuring the look-through passage to extend through the connecting unit (including the heating unit), the bonding apparatus can not only achieve better alignment of the electrical component with the bonding area of the base member, but also heating of the electrical component during the bonding process.

The heating unit may include a plurality of heating elements arranged along a boundary of the look-through passage. For example, the look-through passage may include a plurality of slots and each heating element may be arranged between adjacent ones of the slots. Each heating element may include a first edge substantially parallel to one of the slots between which the heating element is arranged, and a second edge substantially parallel to the other one of the slots between which the heating element is arranged. This helps to reduce the size of the connecting unit, and thus, the size of the bonding apparatus. It also helps to improve the evenness of the heating surface and hence, the bonding quality.

BRIEF DESCRIPTION OF THE FIGURES

Embodiments of the invention will now be illustrated for the sake of example only with reference to the following drawings, in which:

FIGS. 2A to 2H show side views illustrating a method of using the bonding apparatus of FIGS. 1A to 1E, wherein FIG. 2A shows the bonding apparatus arranged above a bonding area, FIG. 2B shows the bonding apparatus moving towards an electrical component, FIG. 2C shows the bonding apparatus being aligned with the electrical component, FIG. 2D shows the bonding apparatus moving to pick up the electrical component, FIG. 2E shows the bonding apparatus locating the electrical component over the bonding area, FIG. 2F shows the electrical component being aligned by the bonding apparatus, FIG. 2G shows the bonding apparatus moving towards the bonding area, and FIG. 2H shows the electrical component being bonded at the bonding area;

DETAILED DESCRIPTION OF THE EMBODIMENTS

Figure 1A:
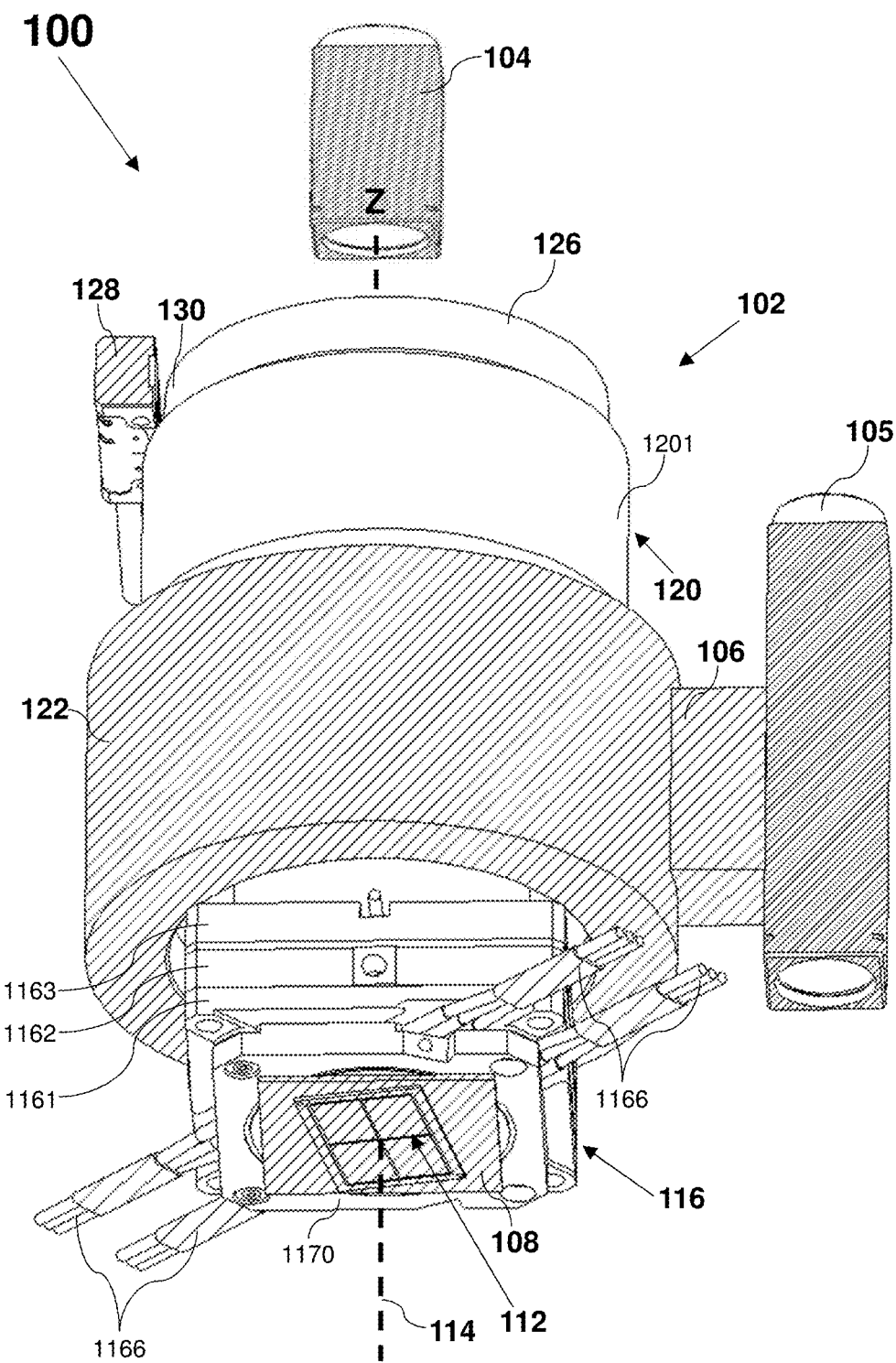
FIGS. 1A, 1B, 1C respectively show a perspective view, a top view and a side view of a bonding apparatus according to an embodiment of the present invention.
Figure 1B:
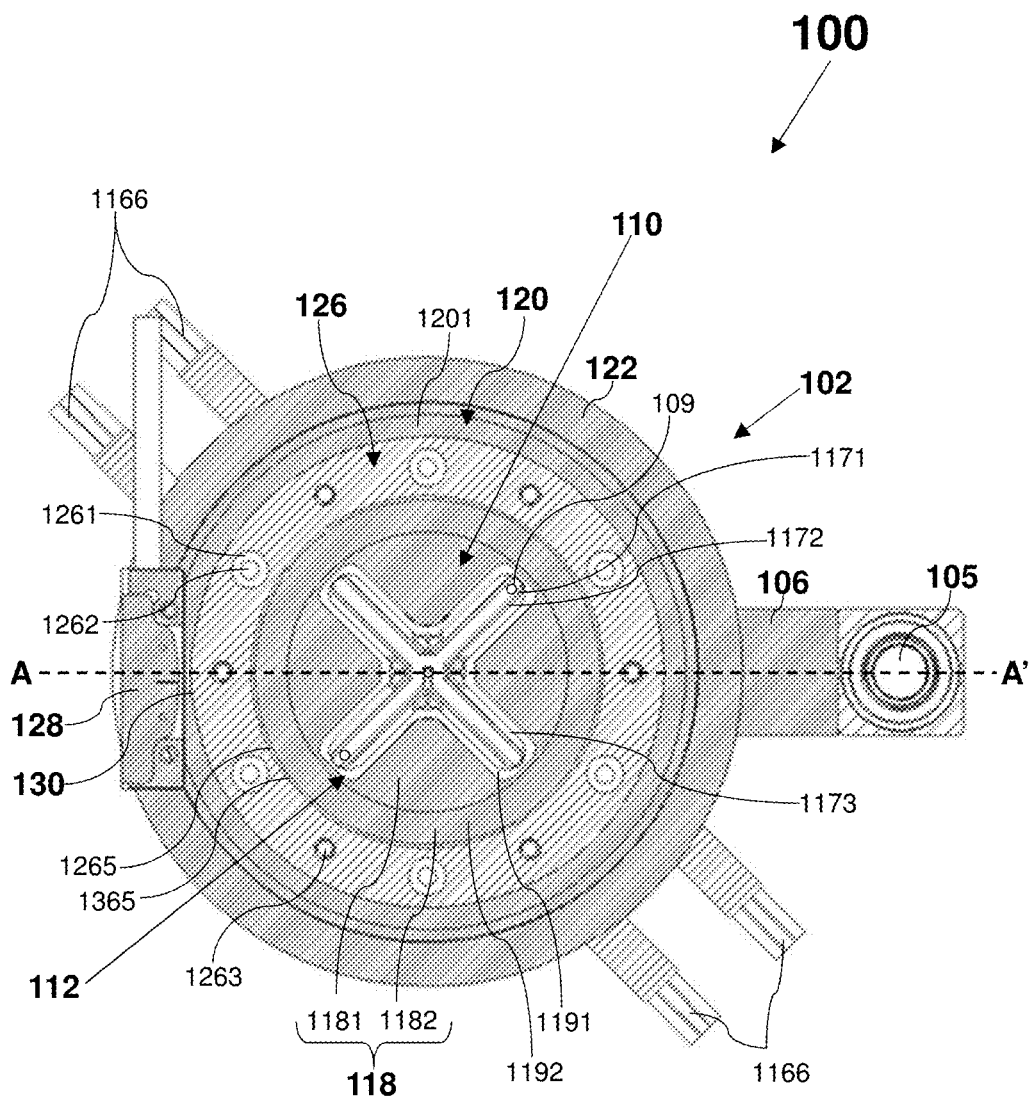
Figure 1C:
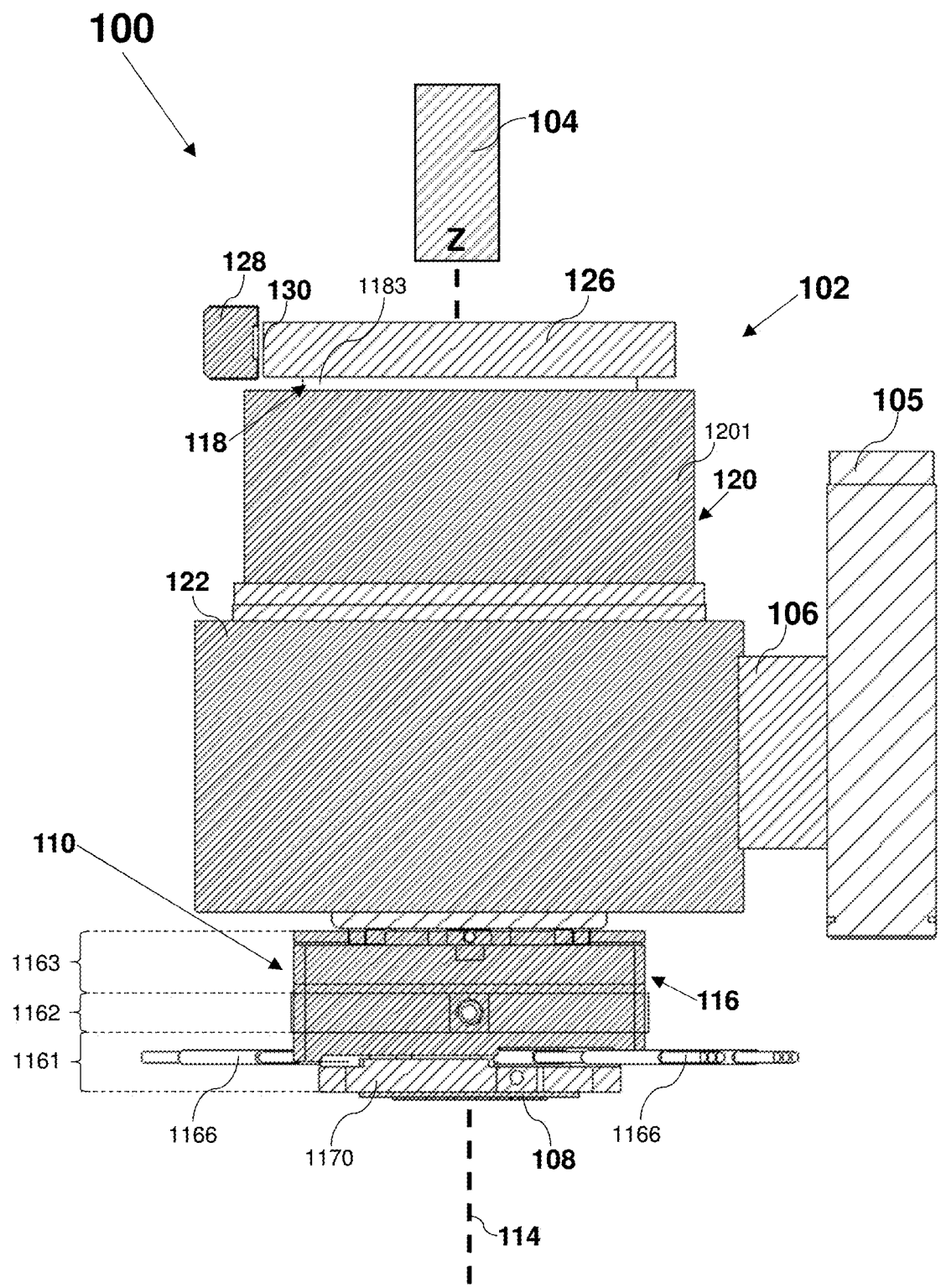
Figure 1D:
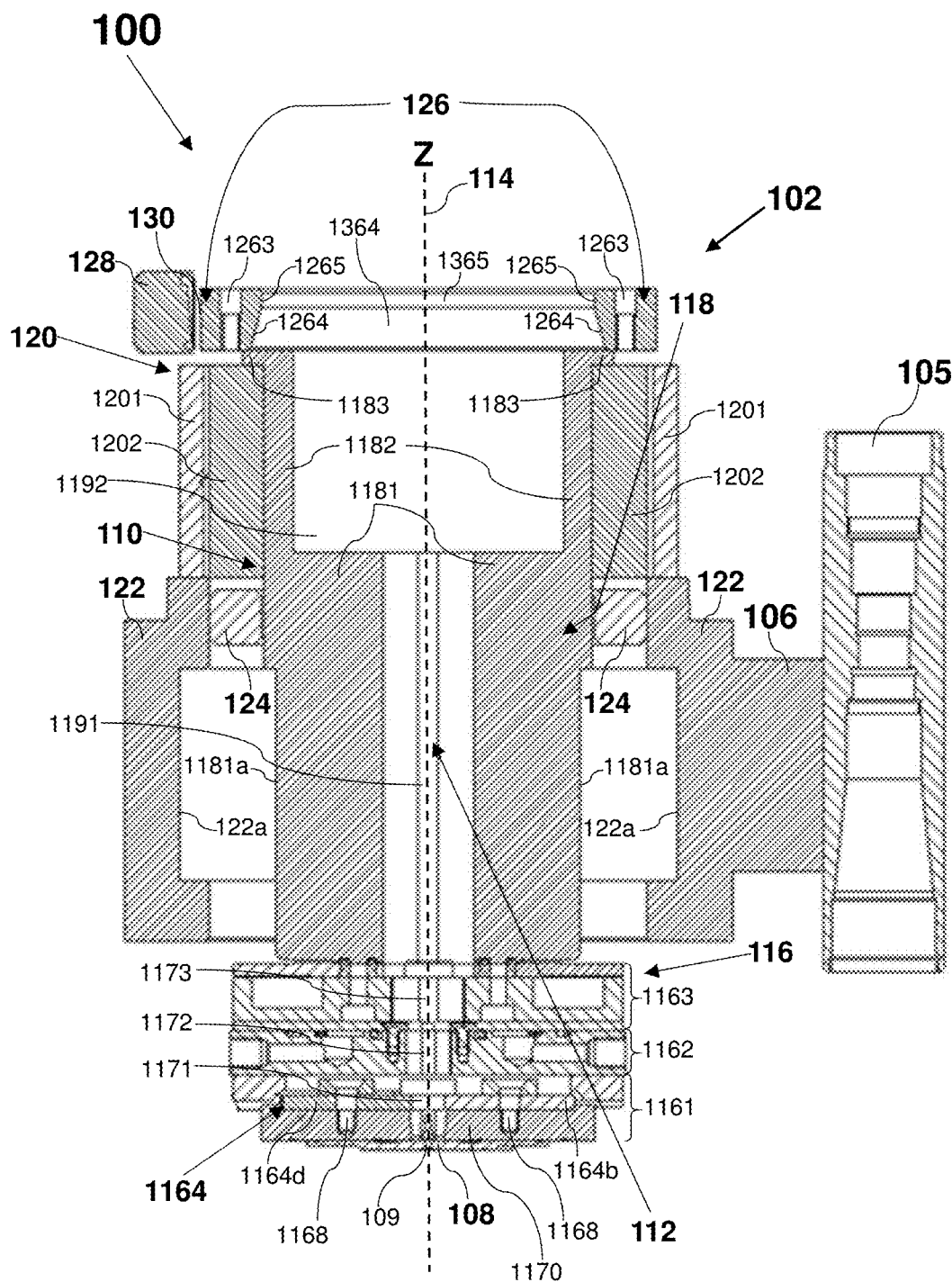
FIG. 1D shows a cross-sectional view of the bonding apparatus of FIGS. 1A to 1C.

FIGS. 1A, 1B and 1C respectively show a perspective view, a top view and a side view of a bonding apparatus 100 according to an embodiment of the present invention. FIG. 1D shows a cross-sectional view of the bonding apparatus 100 along the line A-A' of FIG. 1B.

The bonding apparatus 100 includes a bond head structure 102, a first optical unit 104 and a second optical unit 105. As shown in FIGS. 1A and 1C, the first optical unit 104 is positioned above the bond head structure 102 and the second optical unit 105 is connected to the bond head structure 102 via a connecting element 106. For simplicity, the first optical unit 104 is not shown in FIGS. 1B and 1D.

The bond head structure 102 includes a bond head collet 108 configured to hold an electrical component (for example, a die) to be bonded to a bonding area of a base member (for example, a substrate). The bond head collet 108 is formed of opaque material and also serves as a pick-up tool for picking up the electrical component from a component holder prior to the bonding process. The bond head structure 102 further includes a connecting unit 110 attached to the bond head collet 108. As shown in FIG. 1D, the bond head structure 102 includes look-through passage, which may be in the form of a cavity 112 extending through the bond head collet 108 and the connecting unit 110 along a central axis 114 (Z axis) of the bond head structure 102.

Referring to FIG. 1D, the connecting unit 110 includes an adaptor member 116 attached to the bond head collet 108. The adaptor member 116 includes first, second and third adaptor member portions 1161, 1162, 1163. The first adaptor member portion 1161 is attached to the bond head collet 108, the second adaptor member portion 1162 is attached to the first adaptor member portion 1161 and the third adaptor member portion 1163 is attached to the second adaptor member portion 1162. Connectors (not shown in the figures) are provided to attach the bond head collet 108 to the adaptor member 116 and these connectors are removable to change the bond head collet 108 to a different type for holding a different type of electrical component.

Figure 1E:
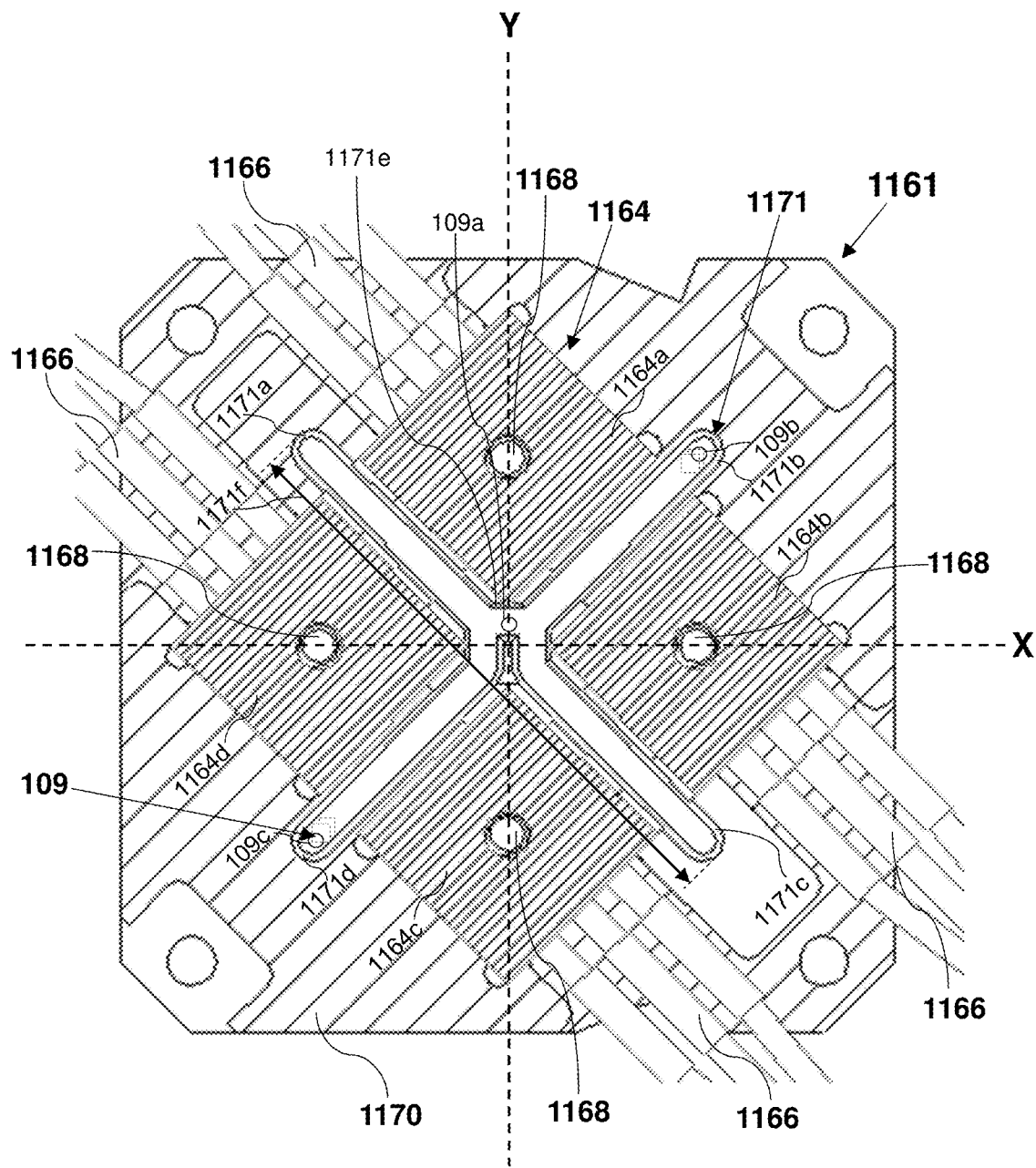
FIG. 1E shows a top view of a part of the bonding apparatus of FIGS. 1A to 1C.

FIG. 1E shows a top view of the first adaptor member portion 1161, together with the bond head collet 108.

As shown in FIG. 1E, the first adaptor member portion 1161 includes a support element 1170 and a central aperture 1171 extending through the support element 1170 along the central axis 114. The central aperture 1171 forms part of the cavity 112. The central aperture 1171 includes a cross-section (perpendicular to the central axis 114) that is cross-shaped. In particular, the central aperture 1171 includes a plurality of slots including a first slot 1171a, a second slot 1171b, a third slot 1171c and a fourth slot 1171d. The slots 1171a-1171d are symmetrically arranged about X and Y axes perpendicular to the central axis 114. More specifically, the slots 1171a-1171d are radially arranged around the central axis 114 with a same angle between adjacent slots 1171a-1171d. The first slot 1171a is arranged diametrically opposed to the third slot 1171c with respect to the central axis 114, and the second slot 1171b is arranged diametrically opposed to the fourth slot 1171d with respect to the central axis 114. As shown in FIG. 1E, the slots 1171a-1171d are joined to a substantially circular middle portion 1171e of the central aperture 1171.

A heating unit 1164 is provided within the first adaptor member portion 1161 of the adaptor member 116. The heating unit 1164 is configured to provide heat during bonding of the electrical component to the bonding area of the base member. Referring to FIG. 1E, the heating unit 1164 includes a plurality of heating elements including a first heating element 1164a, a second heating element 1164b, a third heating element 1164c and a fourth heating element 1164d arranged around a boundary of the central aperture 1171 of the first adaptor member portion 1161. Each heating element 1164a-1164d is arranged between adjacent ones of the slots 1171a-1171d of the central aperture 1171. In particular, the first heating element 1164a is arranged between the first slot 1171a and the second slot 1171b, the second heating element 1164b is arranged between the second slot 1171b and the third slot 1171c, the third heating element 1164c is arranged between the third slot 1171c and the fourth slot 1171d, and the fourth heating element 1164d is arranged between the fourth slot 1171d and the first slot 1171a. As shown in FIG. 1E, each heating element 1164a-1164d has a substantially square shape and is oriented with respect to the slots 1171a-1171d of the central aperture 1171, such that each heating element 1164a-1164d includes a first edge substantially parallel to one of the slots 1171a-1171d between which the heating element 1164a-1164d is arranged, and a second edge substantially parallel to the other one of the slots 1171a-1171d between which the heating element 1164a-1164d is arranged. Further, each heating element 1164a-1164d is sized such that the first and second edges are approximately a same length as the slots 1171a-1171d between which the heating element 1164a-1164d is arranged. Conductive lines 1166 in the form of electrical wires are connected to each heating element 1164a-1164d to supply power to the heating element 1164a-1164d. Further, a connector 1168 in the form of a screw secures approximately a centre of each heating element 1164a-1164d to the support element 1170.

As shown in FIG. 1E, the bond head collet 108 also includes a plurality of cut-out apertures 109, such as a central aperture 109a extending therethrough along the central axis 114, and first and second fiducial apertures 109b, 109c that are located at positions corresponding to fiducial marks 204a, 204b that are formed on the electrical component that is picked up. Each fiducial aperture 109b, 109c is slightly larger than a respective fiducial mark 204a, 204b that it corresponds to. The fiducial apertures 109b, 109c allow the first optical unit 104 to directly inspect the electrical component while maximizing heat and force transmission through the bond head collet 108. The bonding apparatus 100 is designed in such a way that the fiducial marks 204a, 204b on the electrical component and the fiducial apertures 109b, 109c are aligned with the orientation of the central aperture 1171.

Referring to FIG. 1E, the central aperture 1171 of the first adaptor member portion 1161 has a transverse width 1171f perpendicular to the central axis 114. As shown in FIG. 1E, the fiducial apertures 109b, 109c of the bond head collet 108 are substantially aligned with the central aperture 1171 of the adaptor member 116. Accordingly, the first and second fiducial apertures 109b, 109c are respectively positioned within the second and fourth slots 1171b, 1171d of the central aperture 1171. The central aperture 109a is also positioned within the middle portion 1171e of the central aperture 1171.

Referring to FIG. 1D, the second and third adaptor member portions 1162, 1163 also include central apertures 1172, 1173 extending through them along the central axis 114. The central apertures 1172, 1173 of the second and third adaptor member portions 1162, 1163 are substantially similar to the central aperture 1171 of the first adaptor member portion 1161. In other words, each of the central apertures 1172, 1173 of the second and third adaptor member portions 1162, 1163 also includes a cross-section (perpendicular to the central axis) that is cross-shaped. Further, each central aperture 1172, 1173 also includes a same number of slots and a middle portion, and these slots and middle portions are shaped and arranged in a similar manner as those of the central aperture 1171 of the first adaptor member portion 1161. The transverse width (perpendicular to the central axis 114) of the central aperture 1173 of the third adaptor member portion 1163 is greater than the transverse width (perpendicular to the central axis 114) of the central aperture 1172 of the second adaptor member portion 1162, which is in turn greater than the transverse width (perpendicular to the central axis 114) of the central aperture 1171 of the first adaptor member portion 1161. The central apertures 1171, 1172, 1173 of the first, second and third adaptor member portions 1161, 1162, 1163 are substantially aligned with one another.

The connecting unit 110 further includes an actuating member 118 in the form of a rotary shaft attached to the adaptor member 116. Accordingly, the actuating member 118 is connected to the bond head collet 114 by the adaptor member 116. The actuating member 118 includes a first actuating member portion 1181 and a second actuating member portion 1182 arranged above the first actuating member portion 1181 nearer to the first optical unit 104. The actuating member 118 further includes a recess 1181a around an outer surface of the first actuating member portion 1181. In addition, an extension 1183 protrudes from an outer surface of the second actuating member portion 1182 around a top of this portion 1182.

As shown in FIG. 1D, each of the first and second actuating member portions 1181, 1182 of the actuating member 118 has a hollow cylindrical structure including a respective central aperture 1191, 1192 extending therethrough along the central axis 114. The central aperture 1191 of the first actuating member portion 1181 also includes a cross-section (perpendicular to the central axis 114) with a same shape as the cross-sections (perpendicular to the central axis 114) of the central apertures 1171, 1172, 1173 of the first, second and third adaptor member portions 1161, 1162, 1163. In other words, the cross-section of the central aperture 1191 of the first actuating member portion 1181 is also cross-shaped and includes a same number of slots and a middle portion that are shaped and arranged in a similar manner as the central apertures 1171, 1172, 1173. On the other hand, the central aperture 1192 of the second actuating member portion 1182 has a substantially circular cross-section (perpendicular to the central axis 114). The central apertures 1191, 1192 of the first and second actuating member portions 1181, 1182 are substantially aligned, in other words, the centers of these apertures 1191, 1192 lie along a same vertical axis (the central axis 114). However, the transverse width perpendicular to the central axis 114 (or in other words, the diameter) of the circular central aperture 1192 of the second actuating member portion 1182 is greater than the transverse width perpendicular to the central axis 114 of the cross-shaped central aperture 1191 of the first actuating member portion 1181.

As described above, the connecting unit 110 includes a plurality of central apertures 1171, 1172, 1173, 1191, 1192 of the adaptor member portions 1161, 1162, 1163 and the actuating member portions 1181, 1182. These central apertures 1171, 1172, 1173, 1191, 1192 are substantially aligned with one another to form the cavity 112. In particular, the centres of these apertures 1171, 1172, 1173, 1191, 1192, 109 lie along a same vertical axis (the central axis 114). However, the transverse widths of the central apertures 1171, 1172, 1173, 1191, 1192 are different and decrease away from the first optical unit 104. The cross-shaped central apertures 1171, 1172, 1173, 1191 of the adaptor member portions 1161-1163 and the first actuating member portion 1181 form a first portion of the cavity 112. The first to fourth slots (e.g. slots 1171a-1171d) of these cross-shaped central apertures 1171, 1172, 1173, 1191 are substantially aligned to form the first to fourth slots of the cavity 112 respectively. The circular central aperture 1192 of the second actuating member portion 1182 forms a second portion of the cavity 112 that is nearer the first optical unit 104 than the first portion of the cavity 112. In other words, the cavity 112 includes a cut-out cross-slot and a circular aperture above this cross-slot.

The bond head structure 102 further includes an actuator unit 120 in the form of a rotational motor. The actuator unit 120 has a stationary element 1201 in the form of a stationary magnet and a movable element 1202 in the form of a movable coil, although it should be appreciated that the design may instead comprise a stationary coil that is arranged outside a movable magnet. The stationary and movable elements 1201, 1202 of the actuator unit 120 have hollow cylindrical structures with cylindrical apertures. The movable element 1201 is arranged within the cylindrical aperture of the stationary element 1202 and the second actuating member portion 1182 extends within the cylindrical aperture of the movable element 1202. The actuator unit 120 is configured to rotate the actuating member 118 (and hence, the adaptor member 116 and the bond head collet 108) about the central axis 114. In particular, the movable element 1202 of the actuator unit 120 is connected to the actuating member 118 (more specifically, to the second actuating member portion 1182 and the extension 1183), and the actuator unit 120 can be actuated to rotate its movable element 1202 (together with the actuating member 118 connected to it) about the central axis 114 relative to its stationary element 1201.

The bond head structure 102 further includes an actuator casing 122 in the form of a stationary bracket on which the stationary element 1201 of the actuator unit 120 is connected. The actuator casing 122 has a cylindrical structure with a cylindrical aperture through which the actuating member 118 extends. The actuator casing 122 is spaced apart from the actuating member 118. A recess 122a is provided around an inner surface of the actuator casing 122 and is arranged to face the recess 1181a of the first actuating member portion 1181, with the top of these recesses 122a, 1181a aligned.

A compliant element 124 having a ring structure is provided between the first actuating member portion 1181 of the actuating member 118 and the actuator casing 122. In particular, the compliant element 124 is arranged around the first actuating member portion 1181 and is in the form of a compliant air bearing having a compliant compartment with a thin film of compressed air acting as a compliant layer. The actuating member 118 is movable along the central axis 114 relative to the compliant element 124 and the compliant element 124 serves to reduce the frictional force against this movement. Further, the compliant element 124 is compressible by rotation of the actuating member 118 about the X and Y axes perpendicular to the central axis 114. For example, when a moment force is exerted on the actuating member 118, the actuating member 118 can rotate about the X or Y axis perpendicular to the central axis 114 by compressing the compliant element 124. However, the compliant compartment of the compliant element 124 also has a degree of stiffness such that only a limited portion of it is compressible. Accordingly, the degree of rotation of the actuating member 118 about the X and Y axes perpendicular to the central axis 114 is limited.

As shown in FIGS. 1A to 1D, a cover 126 is provided over the actuating member 118. Referring to FIG. 1B, the cover 126 includes a plurality of circular recesses 1261, together with respective first engaging elements 1262 provided therein. A plurality of second engaging elements 1263 extend through the cover 126 as shown in FIG. 1D. The circular recesses 1261 and the second engaging elements 1263 are arranged in an alternating manner around a top surface of the cover 126. Referring to FIG. 1D, the cover 126 is arranged to sit on the extension 1183 of the actuating member 118. The cover 126 includes lower and upper inner surfaces 1264, 1265. The upper inner surface 1265 defines a cylindrical aperture 1365, whereas the lower inner surface 1264 tapers towards the upper inner surface 1265 and defines a frusto-conical aperture 1364. A top of this frusto-conical aperture 1364 is aligned with the cylindrical aperture 1365 defined by the upper inner surface 1265. Further, the apertures 1364, 1365 of the cover 126 are aligned with the cavity 112 of the bond head structure 102 to form a hole through the bonding apparatus 100 to allow the first optical unit 104 to look through the bonding apparatus 100.

The bond head structure 102 further includes an encoder element 128 in the form of a theta encoder and a guide element 130 in the form of a theta encoder scale. The encoder element 128 is fixed in position adjacent to the cover 126 and the guide element 130 is attached to an outer surface of the cover 126, such that it faces the encoder element 128. The encoder element 128 is configured to cooperate with the guide element 130 to determine a rotational displacement of the cover 126 (and hence, of the bond head collet 108 connected to the cover 126 by the connecting unit 110) relative to the X axis. The rotational displacement may be in the form of an angle theta measured with respect to the X axis.

FIGS. 2A to 2H show side views illustrating a method of using the bonding apparatus 100 according to an embodiment of the present invention.

Figure 2A:
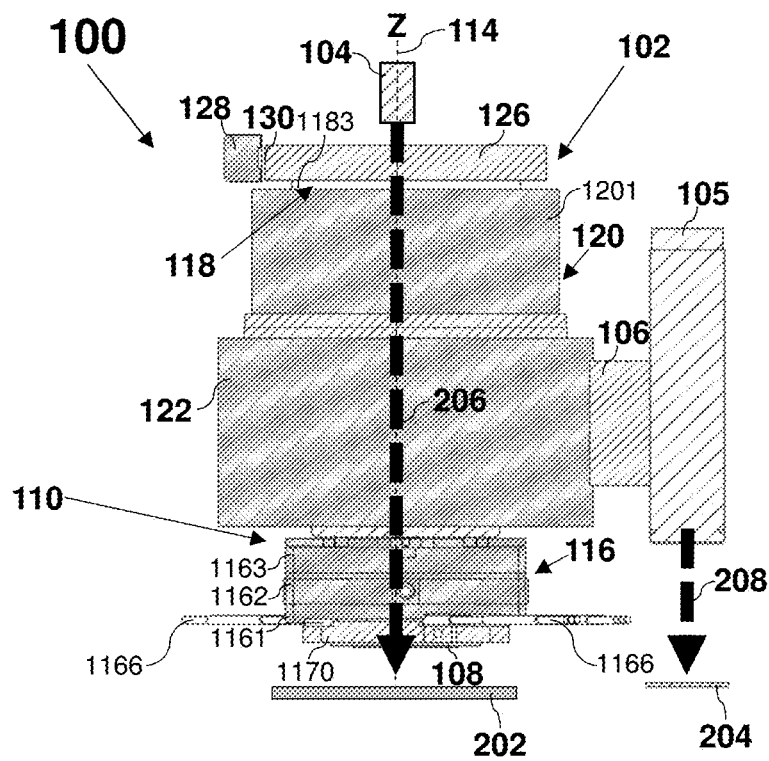

Referring to FIG. 2A, the bonding apparatus 100 is initially arranged with the bond head structure 102 at a first position above a base member 202. The bond head structure 102 is positioned relative to the first optical unit 104 to allow the first optical unit 104 to view a bonding area of the base member 202 through the hole (formed by the cavity 112 and the apertures 1364, 1365 of the cover 126). When the bond head structure 102 is at this first position, the second optical unit 105 is above an electrical component 204 to be bonded to the bonding area of the base member 202, with the electrical component 204 arranged on a component holder. As indicated by the arrow 206, a first image showing the bonding area of the base member 202 is captured by the first optical unit 104 and as indicated by the arrow 208, a second image showing the electrical component 204 on the component holder is captured by the second optical unit 105.

Figure 2B:
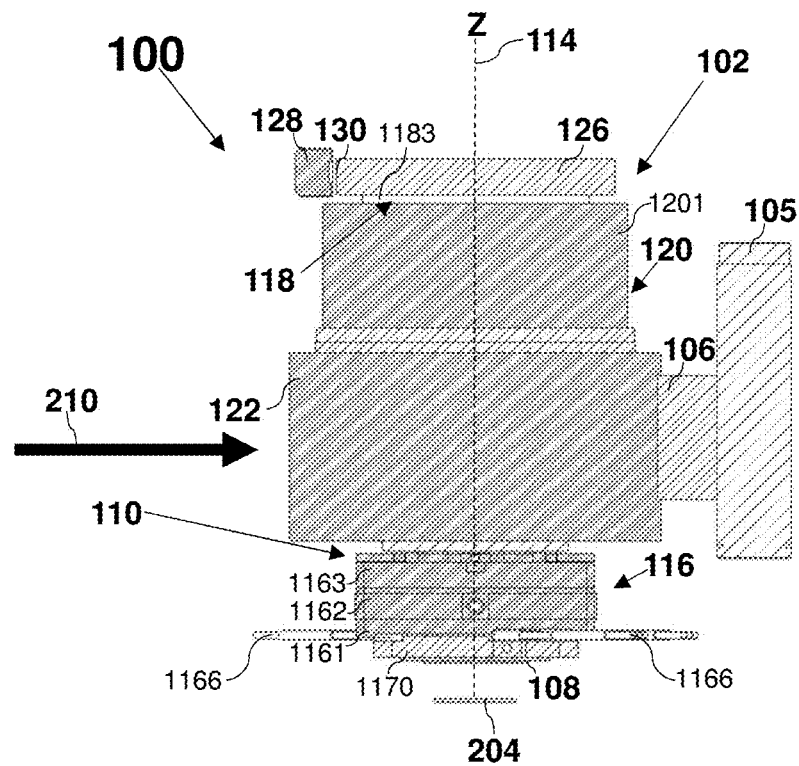

Referring to FIG. 2B, as indicated by the arrow 210, the bonding apparatus 100 is then moved by a further actuator unit such as a XY motion table (not shown in the figures) to a second position where the bond head structure 102 is above the electrical component 204 on the component holder.

Figure 2C:
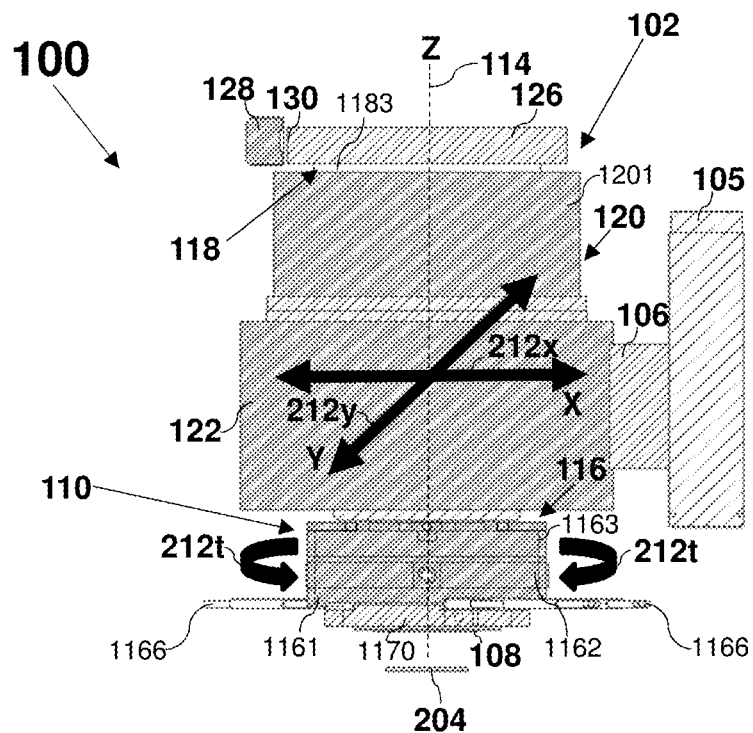

Referring to FIG. 2C, when the bonding apparatus 100 is at the second position, the bond head collet 108 is adjusted to align the bond head collet 108 with the electrical component 204 on the component holder. In particular, the bond head collet 108 is adjusted by rotating the actuating member 118 about the central axis 114 using the actuator unit 120 (as indicated by the arrow 212*t*), moving the bond head structure 102 along an X direction perpendicular to the central axis 114 using the further actuator unit (as indicated by the arrow 212*x*) and/or moving the bond head structure 102 along a Y direction perpendicular to the central axis 114 using the further actuator unit (as indicated by the arrow 212*y*). The amount of adjustment to be made to the bond head collet 108 is determined using the above-mentioned second image captured by the second optical unit 105.

Figure 2D:
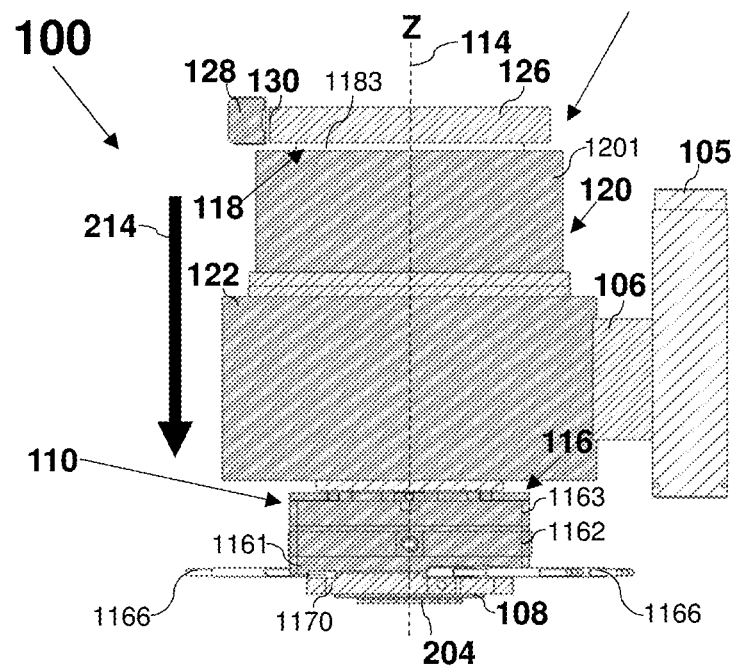

Referring to FIG. 2D, the further actuator unit then moves the bond head structure 102 towards the component holder (as indicated by the arrow 214). The bond head collet 108 is thus moved towards the component holder to pick up the electrical component 204 from the component holder.

Figure 2E:
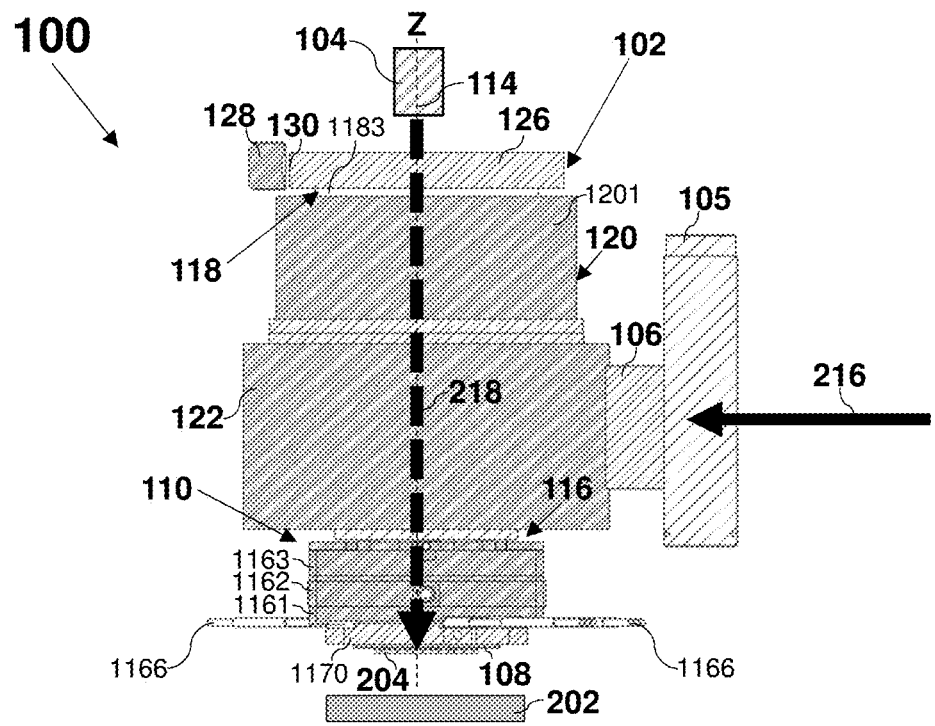

Referring to FIG. 2E, the further actuator unit then moves the bond head structure 102 (with the bond head collet 108 holding the electrical component 204) back to the first position above the base member 202 as indicated by the arrow 216. When the bond head structure 102 is at this first position, the first optical unit 104 is positioned relative to the bond head structure 102 to view the electrical component 204 through the hole (formed by the cavity 112 and the apertures 1364, 1365 of the cover 126) of the bond head structure 102. As indicated by the arrow 218, the first optical unit 104 then captures a third image showing the electrical component 204 held by the bond head collet 108 above the base member 202.

Figure 3A:
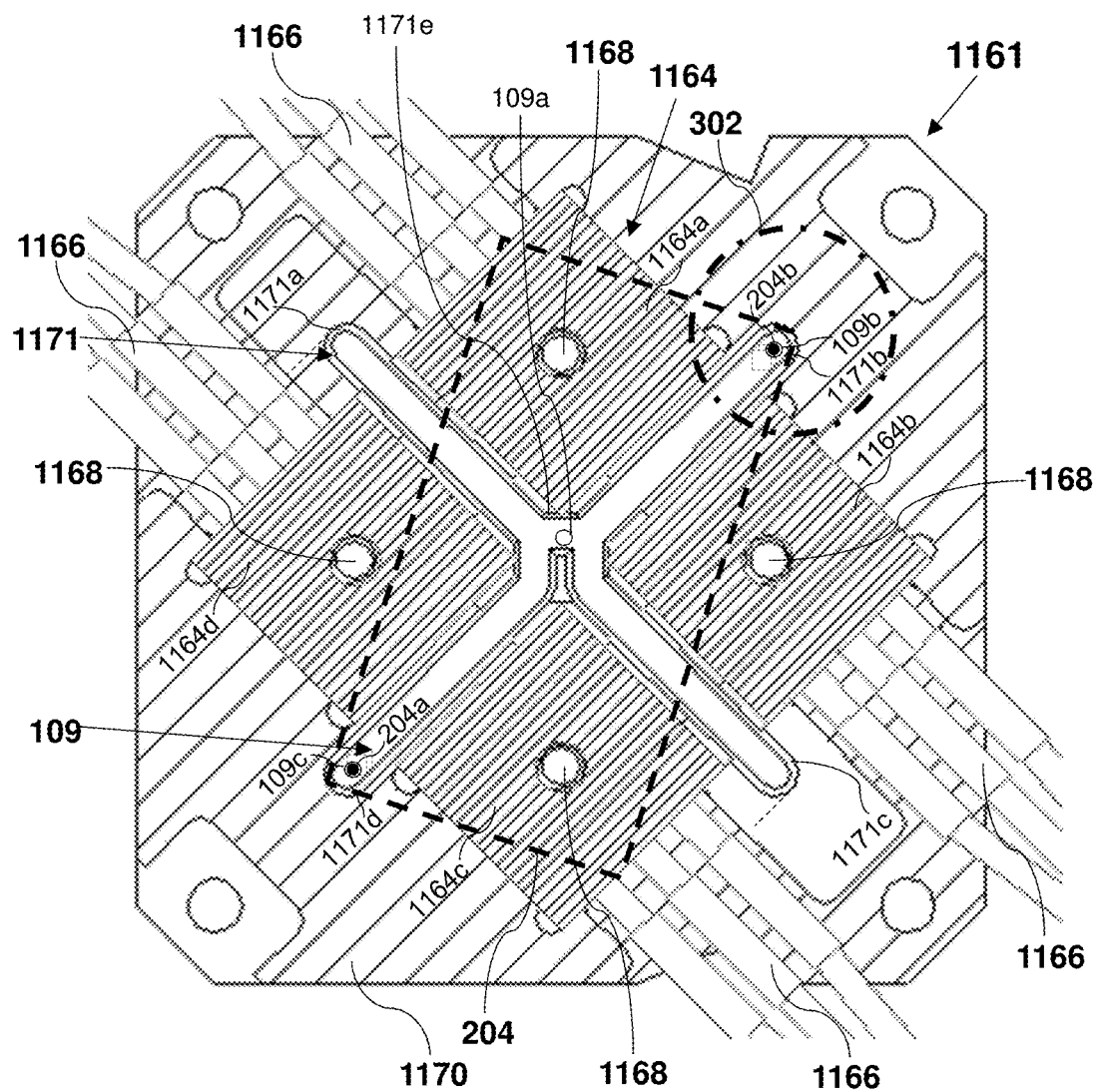
FIG. 3A shows a top view of a part of the bonding apparatus of FIGS. 1A to 1E and an electrical component held by the bonding apparatus.
Figure 3B:
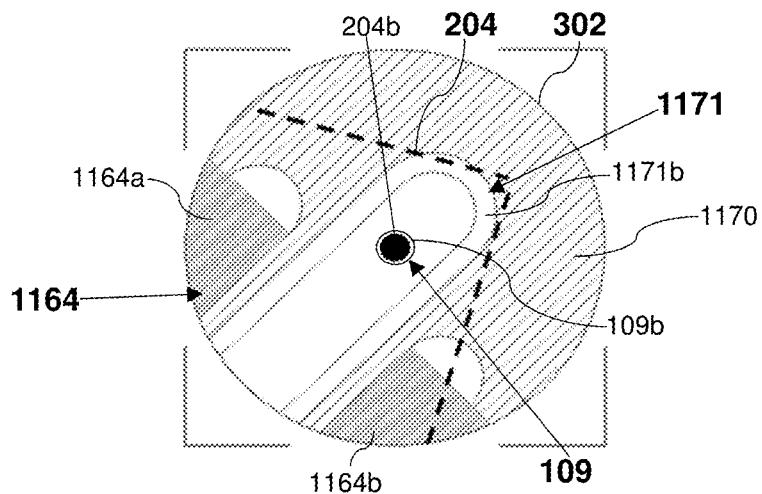
FIG. 3B shows a magnified view of a portion of FIG. 3A.

FIG. 3A shows a top view of the first adaptor member portion 1181 and the bond head collet 108, together with the electrical component 204 held by the bond head collet 108 when the bond head structure 102 is at the first position as shown in FIG. 2E. FIG. 3B shows a magnified view of a portion 302 of FIG. 3A.

Referring to FIGS. 3A and 3B, the electrical component 204 includes a surface (facing the bond head collet 108) having a first fiducial mark 204*a* and a second fiducial mark 204*b* (in the form of fiducial marks) thereon. The cavity 112 is configured to allow the first optical unit 104 to view the first and second fiducial marks 204*a*, 204*b* through the cavity 112. In particular, the cavity 112 is configured to allow the first optical unit 104 to view the fiducial marks 204*a*, 204*b* such that a boundary of the cavity 112 is arranged partially around each mark 204*a*, 204*b*. As shown in FIG. 3A, the cavity 112 is configured to allow the first optical unit 104 to view the first fiducial mark 204*a* at the end of the second slot of the cavity 112 (or more specifically, at the first fiducial aperture 109*b* of the bond head collet 108) and the second fiducial mark 204*b* at the end of the fourth slot of the cavity 112 (or more specifically, at the second fiducial aperture 109*c* of the bond head collet 108). Accordingly, the third image captured by the first optical unit 104 shows the fiducial marks 204*a*, 204*b* of the electrical component 204 within the second and fourth slots of the cavity 112 respectively.

Occasionally, the electrical component 204 on the component holder may be misaligned. The positions of the fiducial marks 204*a*, 204*b* of this electrical component 204 may be determined using the second image captured by the second optical unit 105, and the bond head collet 108 may be adjusted accordingly as shown in FIG. 2C to align the bond head collet 108 with the electrical component 204, so that the fiducial marks 204*a*, 204*b* are at the above-described positions. Further, the electrical component 204 may sometimes be different from that shown in FIG. 3. For example, it may be of a different size and/or may include a different number of fiducial marks arranged in a different manner. Prior to picking up this different electrical component 204, the bond head collet 108 may be adjusted using the positions of the fiducial marks shown in the second image, so that the first optical unit 104 can subsequently view the fiducial marks of the different electrical component 204 as lying within the cavity 112.

Figure 2F:
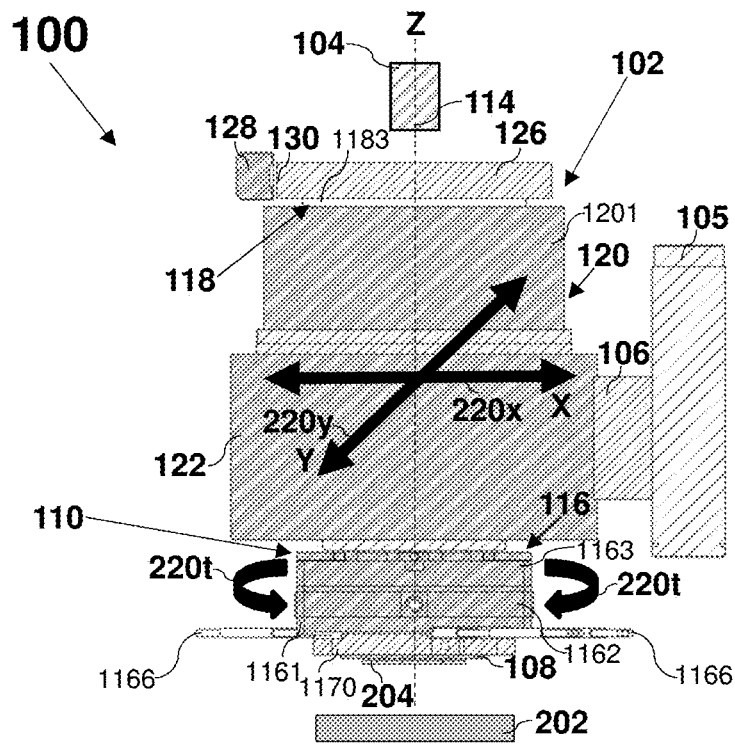

Referring to FIG. 2F, after the bond head structure 102 is moved to the first position above the base member 202, the actuator unit 120 and/or the further actuator unit are actuated to move the connecting unit 110 based on the view of the electrical component 204 by the first optical unit 104 (or in other words, based on the third image). This adjusts the bond head collet 108 to align the electrical component 204 held by the bond head collet 108 with the bonding area of the base member 202. In particular, although the first optical unit 104 is only able to view a portion of the electrical component 204 (and not the entire electrical component 204) through the cross-slot of the cavity 112, this visible portion of the electrical component 204 includes the fiducial marks 204*a*, 204*b* and thus, the third image captured by the first optical unit 104 shows the fiducial marks 204a, 204b. The position and orientation of the electrical component 204 relative to the bonding area can thus be determined by comparing the positions of the fiducial marks 204a, 204b in the third image against the bonding area in the first image. An amount of adjustment to be made to the bond head collet 108 can then be determined accordingly, and the bond head collet 108 is adjusted by this amount of adjustment using the actuator 120 and/or the further actuator unit.

Figure 4:
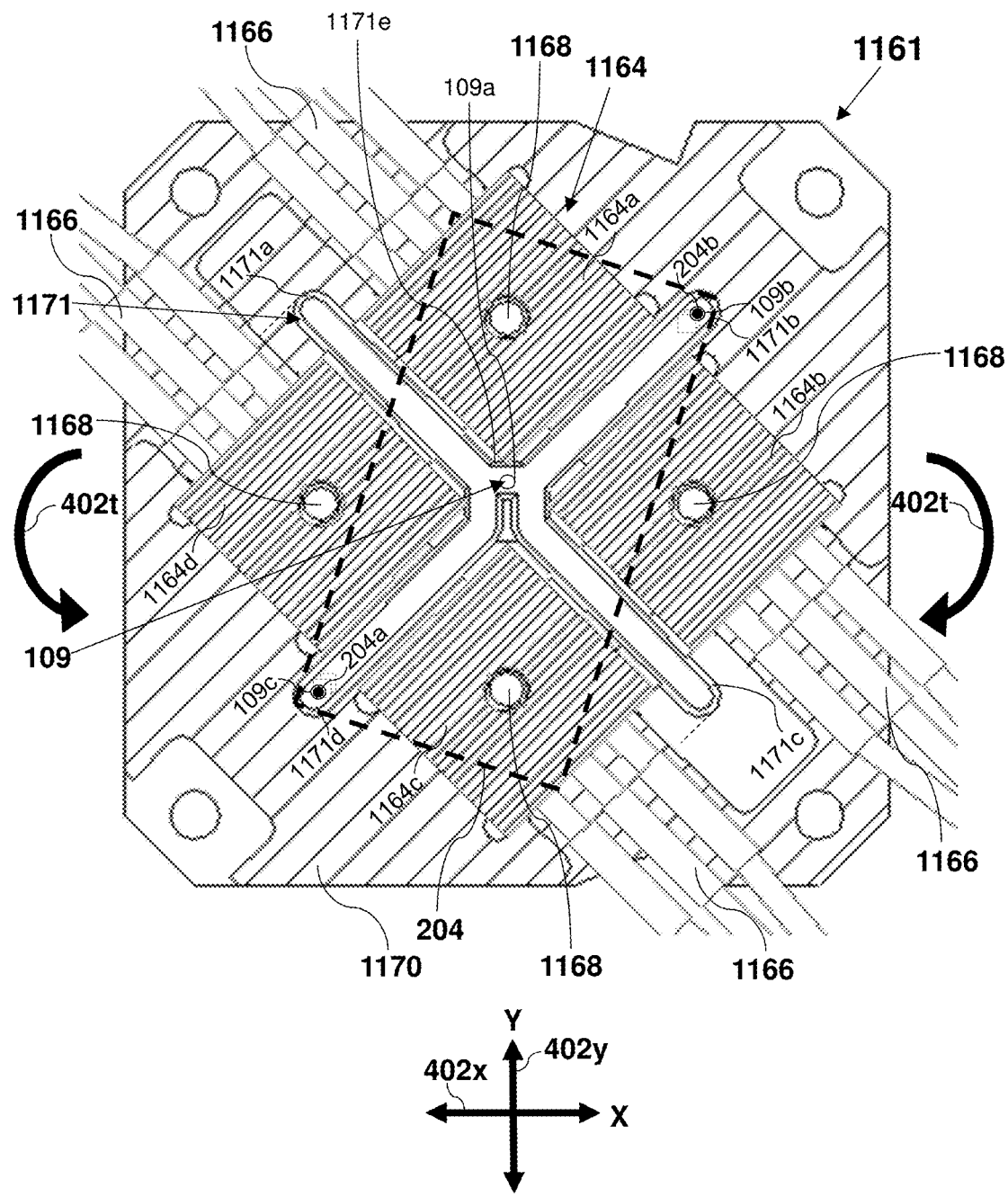
FIG. 4 shows a top view of a part of the bonding apparatus of FIGS. 1A to 1E, and how a bond head collet of the bonding apparatus may be adjusted.

FIG. 4 shows a top view of the first adaptor member portion 1161 and the bond head collet 108, together with arrows 402, 404, 406 indicating how the bond head collet 108 can be adjusted using the actuator unit 102 and the further actuator unit. As shown in FIG. 2F and FIG. 4, the actuator unit 120 is operative to rotate the connecting unit 110 (and thus the bond head collet 108 and the electrical component 204) about the central axis 114 as indicated by the arrows 220t in FIG. 2 and the arrows 402t in FIG. 4. The further actuator unit is operative to move the bond head structure 102 (and thus the bond head collet 108 and the electrical component 204) in X and Y directions perpendicular to the central axis 114 as indicated by the arrows 220x, 220y in FIG. 2 and the arrows 402x, 402y in FIG. 4. During adjustment of the bond head collet 108, the encoder element 128 and the guide element 130 are used to determine the amount of rotational displacement of the bond head collet 114 relative to the X axis, whereas other encoder elements and guide elements (not shown in the figures) may be used to determine the displacement of bond head structure 102 in the X and Y directions.

Figure 2G:
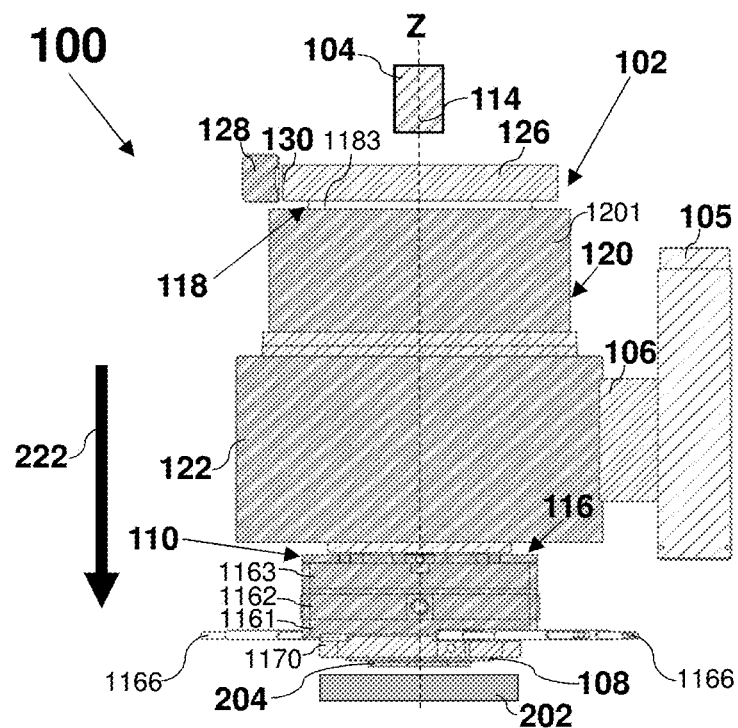

Referring to FIG. 2G, the further actuator unit then moves the bond head structure 102 towards the base member 202 as indicated by the arrow 222 to contact the electrical component 204 with the bonding area of the base member 202.

Figure 2H:
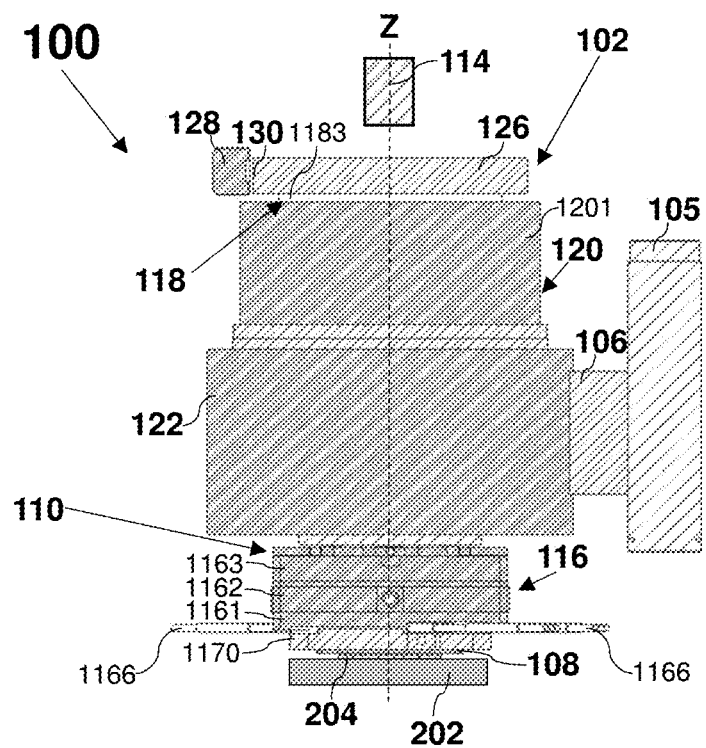

Referring to FIG. 2H, the electrical component 204 is then bonded with the bonding area of the base member 202. During the bonding process, bond forces (of either low or high magnitudes) are exerted on the electrical component 204 and power is supplied to the heating elements 1164a-1164d using the conductive lines 1166 so as to provide heat to the electrical component 204.

Various modifications may be made to the above-described embodiments.

For example, the cavity 112 need not include central apertures 1171, 1172, 1173, 1191, 1192 having different transverse widths. Instead, the cross-section of the cavity 112 may have a same dimension throughout the cavity's 112 length. Alternatively, only some (e.g. two) of the central apertures 1171, 1172, 1173, 1191, 1192 may have different transverse widths, whereas the remaining ones of the central apertures 1171, 1172, 1173, 1191, 1192 may have the same transverse width.

Further, although the cavity 112 is described above as having a first portion with the circular aperture 1192 and a second portion with the cross-shaped apertures 1171, 1172, 1173, 1191, in alternative embodiments, the cavity 112 may have a cross-section that is of a same shape throughout the cavity's 112 length. Alternatively, only some (e.g. two) of the central apertures 1171, 1172, 1173, 1191, 1192 may have differently shaped cross-sections, whereas the remaining ones of the central apertures 1171, 1172, 1173, 1191, 1192 may have cross-sections of the same shape.

In addition, although the cavity 112 is described above as having four slots (including slots 1171a-1171d), the cavity 112 may not include any slot in alternative embodiments, or may alternatively include more than or less than four slots.

The arrangement of the slots of the cavity 112 may also differ from that described above. For example, the slots need not be arranged radially around the central axis 114 and/or the angle between adjacent slots need not be the same.

Also, the compliant element 124 need not be in the form of a compliant air bearing and may for example, be in the form of a compliant roller ball bearing which uses ball rollers arranged within a compliant compartment.

Further, the connecting unit 110 need not include both the actuating member 118 and the adaptor member 116. In some embodiments, the actuating member 118 may be omitted and the actuator unit 120 may be directly attached to the adaptor member 116 to move the adaptor member 116 and the bond head collet 108.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding apparatus comprising:
   a bond head structure comprising:
      a bond head collet configured to hold an electrical component to be bonded to a bonding area of a base member;
      a connecting unit to which the bond head collet is attached; and
      a look-through passage extending through the bond head collet and the connecting unit along a central axis of the bond head structure;
   an optical unit positioned relative to the bond head structure to view and inspect the electrical component through the look-through passage of the bond head structure; and
   an actuator unit configured to move the connecting unit of the bond head structure based on the inspection of the electrical component by the optical unit, to align the electrical component with the bonding area of the base member,
   wherein the look-through passage comprises a plurality of slots radially arranged around the central axis.

2. The bonding apparatus according to claim 1, wherein the plurality of slots are arranged with a same angle between adjacent slots.

3. The bonding apparatus according to claim 1, wherein the look-through passage comprises a first portion comprising the plurality of slots and a second portion comprising a circular aperture, wherein the second portion is nearer to the optical unit than the first portion.

4. The bonding apparatus according to claim 1, wherein the connecting unit comprises a plurality of central apertures substantially aligned to form the look-through passage of the bond head structure, wherein each central aperture has a transverse width perpendicular to the central axis, and at least two of the transverse widths of the central apertures are different.

5. The bonding apparatus according to claim 4, wherein the transverse widths of the central apertures decrease at further distances away from the optical unit.

6. The bonding apparatus according to claim 4, wherein at least two of the central apertures of the connecting unit comprise cross-sections with a same shape, wherein the cross-sections are perpendicular to the central axis.

7. The bonding apparatus according to claim 4, wherein at least two of the central apertures of the connecting unit comprise cross-sections perpendicular to the central axis with different shapes.

8. The bonding apparatus according to claim 4, wherein the bond head collet comprises at least one fiducial aperture that is substantially aligned with the central apertures of the connecting unit to form the look-through passage of the bond head structure.

9. The bonding apparatus according to claim 8, wherein the at least one fiducial aperture comprises at least one circular cut-out from the bond head collet that is aligned with and slightly larger than one or more fiducial marks formed on the electrical component that are viewable through the central apertures.

10. The bonding apparatus according to claim 1, wherein the electrical component comprises a surface including a fiducial mark thereon, and the look-through passage is configured to allow the optical unit to view and inspect the fiducial mark directly through the look-through passage above the bonding area.

11. The bonding apparatus according to claim 10, wherein the look-through passage is configured to allow the optical unit to view and inspect the fiducial mark such that a boundary of the look-through passage is arranged at least partially around the fiducial mark.

12. The bonding apparatus according to claim 10, wherein the look-through passage is configured to allow the optical unit to view and inspect the fiducial mark at an end of one of the plurality of slots.

13. The bonding apparatus according to claim 10, wherein the fiducial mark is a first fiducial mark and the surface of the electrical component includes a second fiducial mark thereon, and wherein the look-through passage is configured to allow the optical unit to view and inspect the first and second fiducial marks of the electrical component through different slots.

14. The bonding apparatus according to claim 1, wherein the connecting unit comprises an adaptor member to which the bond head collet is attached and an actuating member attached between the adaptor member and the actuator unit.

15. The bonding apparatus according to claim 1, wherein the connecting unit comprises a heating unit configured to provide heat during bonding of the electrical component to the bonding area of the base member.

16. The bonding apparatus according to claim 15, wherein the heating unit 20 comprises a plurality of heating elements arranged along a boundary of the look-through passage.

17. The bonding apparatus according to claim 16, wherein each heating element is arranged between adjacent ones of the plurality of slots.

18. The bonding apparatus according to claim 17, wherein each heating element comprises a first edge substantially parallel to one of the slots between which the heating element is arranged, and a second edge substantially parallel to the other one of the slots between which the heating element is arranged.

* * * * *